United States Patent
Jung

(10) Patent No.: US 8,558,946 B2
(45) Date of Patent: Oct. 15, 2013

(54) PCB AND CAMERA MODULE HAVING THE SAME

(75) Inventor: Woong-Tae Jung, Hwasung-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 685 days.

(21) Appl. No.: 12/649,933

(22) Filed: Dec. 30, 2009

(65) Prior Publication Data

US 2011/0063492 A1   Mar. 17, 2011

(30) Foreign Application Priority Data

Sep. 14, 2009   (KR) .................. 10-2009-0086475

(51) Int. Cl.
*H04N 5/232* (2006.01)
*H01L 23/34* (2006.01)
*H01L 23/10* (2006.01)

(52) U.S. Cl.
USPC ........................ 348/374; 257/712; 257/706

(58) Field of Classification Search
USPC ............... 348/374, 373; 250/239; 257/706, 257/712–720
See application file for complete search history.

(56) References Cited

U.S. PATENT DOCUMENTS

| 7,476,976 B2* | 1/2009 | Lange et al. ............. 257/778 |
| 2004/0021220 A1* | 2/2004 | Kubo ..................... 257/706 |

FOREIGN PATENT DOCUMENTS

| JP | 2008-198785 | * | 8/2008 |
| KR | 10-2006-0022192 | | 3/2006 |
| KR | 2006-0022192 | * | 9/2006 |

OTHER PUBLICATIONS

Korean Office Action, w/ partial English translation thereof, issued in Korean Patent Application No. KR 10-2009-0086475 dated Mar. 2, 2011.

* cited by examiner

*Primary Examiner* — Tuan Ho
*Assistant Examiner* — Akshay Trehan
(74) *Attorney, Agent, or Firm* — McDermott Will & Emery LLP

(57) ABSTRACT

A print circuit board and a camera module having the same are disclosed. A printed circuit board of the present invention that is thermally coupled to an electronic device includes: a binding part, which has a binding pad coupled to the electronic device; a first ground, which is arrayed in an area heated at the time of thermal binding; and a second ground, which is connected to the first ground and arrayed adjacent to the binding pad. A multi-layered printed circuit board that is thermally coupled can be formed by forming a heat transfer path that is connected from the heating area to the binding pad through a ground.

8 Claims, 6 Drawing Sheets

PCB AND CAMERA MODULE HAVING THE SAME

CROSS-REFERENCE TO RELATED APPLICATIONS

This application claims the benefit of Korean Patent Application No. 10-2009-0086475 with the Korean Intellectual Property Office on Sep. 14, 2009, the disclosure of which is incorporated herein by reference in its entirety.

BACKGROUND

1. Technical Field

The present invention relates to a printed circuit board and a camera module having the same.

2. Description of the Related Art

Portable terminals, such as mobile phones and PDAs, are used not only as a simple phone but also for multi-convergence of music, movie, TV and game. Accordingly, the demand for a camera module, which is essential for multi-convergence of a portable terminal, is gradually increasing.

This camera module is manufactured with an image sensor, such as CCD or CMOS, as a major component and saves data in the memory in equipment by concentrating an image of an object through the image sensor. The data saved is displayed as a picture through a display media, such as the LCD or PC monitor in the equipment.

Generally, the camera module includes a camera head unit, which has a lens and the image sensor, and a printed circuit board, which is coupled to the camera head unit. Here, the camera head unit and the printed circuit board are thermally joined by solder.

However, the printed circuit board according to the related art may have the structure that is difficult to transfer the heat from the heat resource such as a heater to a part joined to the camera head unit. Accordingly, it has been inevitable that the printed circuit board is composed of single side or double sides in order to transfer the heat. Thus, because the printed circuit board cannot be formed as multi-layered, it is limited to mount components and to form signal lines.

SUMMARY

The present invention provides a printed circuit board having a multi-layered structure which can be coupled to an electronic device by thermal binding and a camera module having the same.

One aspect of the present invention features a printed circuit board that is thermally coupled to an electronic device. The printed circuit board in accordance with an embodiment of the present invention can include: a binding part, which includes a binding pad coupled to the electronic device; a first ground, which is arrayed in an area heated at the time of thermal binding; and a second ground, which is connected to the first ground and arrayed adjacent to the binding pad.

The printed circuit board can also include a multi-layered circuit layer, which has the binding part formed on one side and the first ground formed on the other side.

The circuit layer can include a via, which directly connects the first ground to the second ground.

The first ground can be arrayed to correspond to the binding part.

The circuit layer can also include a third ground, which is connected to the first ground or the second ground and arrayed to correspond to the binding part.

The third ground can be arrayed on a lower side of the binding pad.

The first ground can have a surface contact with a heater.

Another aspect of the present invention features a camera module, which can include: a camera head unit, which has a lens and an image sensor; a printed circuit board, which is coupled to the camera head unit; and a thermal binding member, which is interposed between the camera head unit and the printed circuit board.

The printed circuit board can also include a multi-layered circuit layer, which has a binding part formed on one side and a first ground formed on the other side.

The circuit layer can include a via, which directly connects the first ground to a second ground.

The first ground can be arrayed to correspond to the binding part.

The circuit layer can also include a third ground, which is connected to the first ground or the second ground and arrayed to correspond to the binding part.

The third ground can be arrayed on a lower side of a binding pad.

The thermal binding member can include at least one of a solder and ACF (Anisotropic Conductive Film).

Additional aspects and advantages of the present invention will be set forth in part in the description which follows, and in part will be obvious from the description, or may be learned by practice of the invention.

DETAILED DESCRIPTION

An embodiment of the present invention will be described below in more detail with reference to the accompanying drawings.

Figure 1:
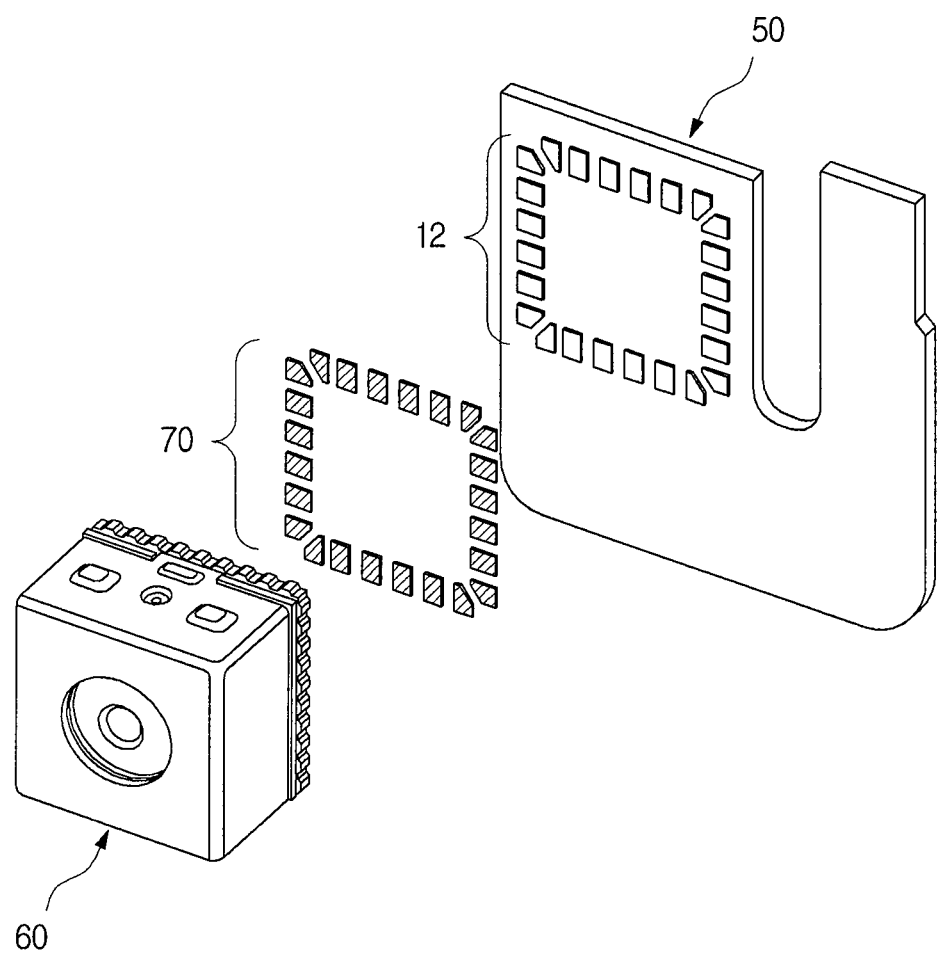
FIG. 1 illustrates an exploded view of a camera module according to an embodiment of the present invention.
Figure 2:
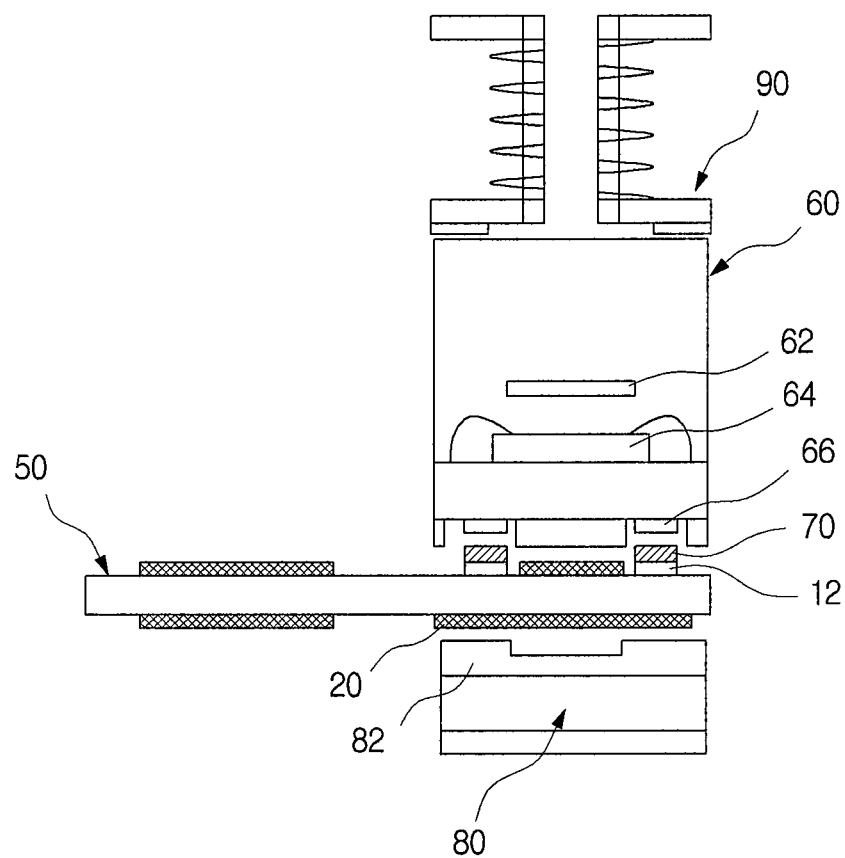
FIG. 2 illustrates the thermal binding process of a camera module according to an embodiment of the present invention.

FIG. 1 illustrates an exploded view of a camera module according to an embodiment of the present invention, and FIG. 2 illustrates the thermal junction process of a camera module according to an embodiment of the present invention.

A camera module according to an embodiment of the invention includes a camera head unit 60, a printed circuit board 50 and thermal binding members 70.

The camera head unit 60 is a part that picks up the image of an object and generates an image data, and has a lens 62 and an image sensor 64, which picks up an image formed by the lens 62.

As illustrated in FIG. 2, the camera head unit 60 has an electrode pad 66, which transfers the image data as electronic signals, and is thermally joined to a binding pads 12 of the printed circuit board 50, which will be described later.

Thermal binding members 70 are melted to connect the binding pads 12 of the printed circuit board 50 and the camera head unit 60, and are interposed between the binding pads 12 and the electrode pad 66.

As illustrated in FIG. 2, since the binding pads 12 is heated by a heater 80, the thermal binding members 70 are heated and melted. Accordingly, the thermal binding members 70 can thermally couple the binding pads 12 to the electrode pad when pressed by a jig 90.

Here, the thermal binding members 70 can include at least one of solder and ACF (Anisotropic Conductive Film) in order to make an electrical connection between the binding pads 12 and the electrode pad.

The printed circuit board 50 is a part that is thermally coupled to the camera head unit 60 and forms a heat transfer path that quickly transfers the heat from the heater 80 to the binding pads 12.

Figure 3:
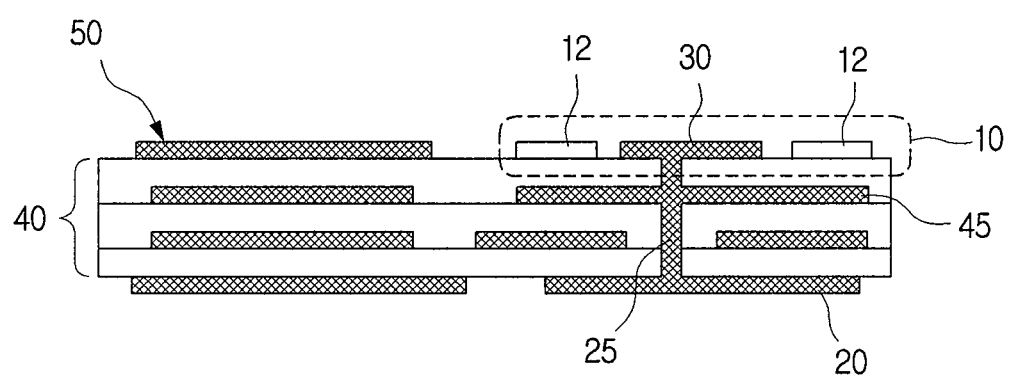
FIG. 3 illustrates a sectional view of a printed circuit board in a camera module according to an embodiment of the present invention.
Figure 4:
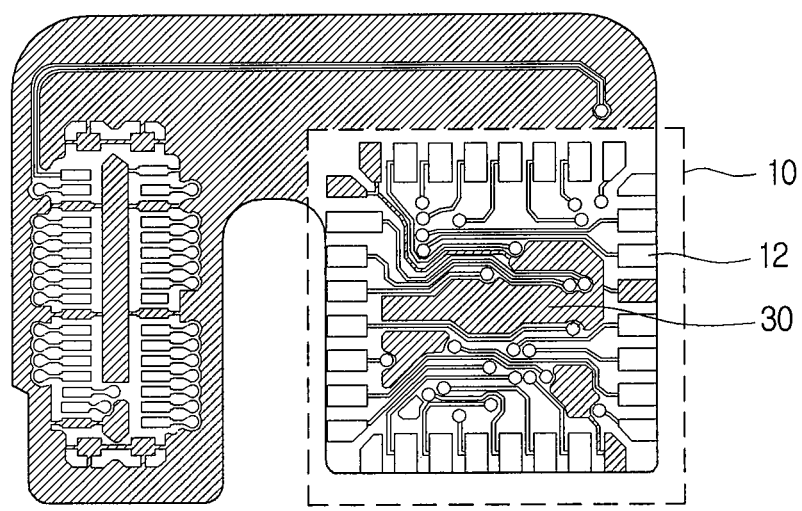
FIG. 4 through FIG. 6 illustrate circuit pattern arrangement of a printed circuit board in a camera module according to an embodiment of the present invention.
Figure 5:
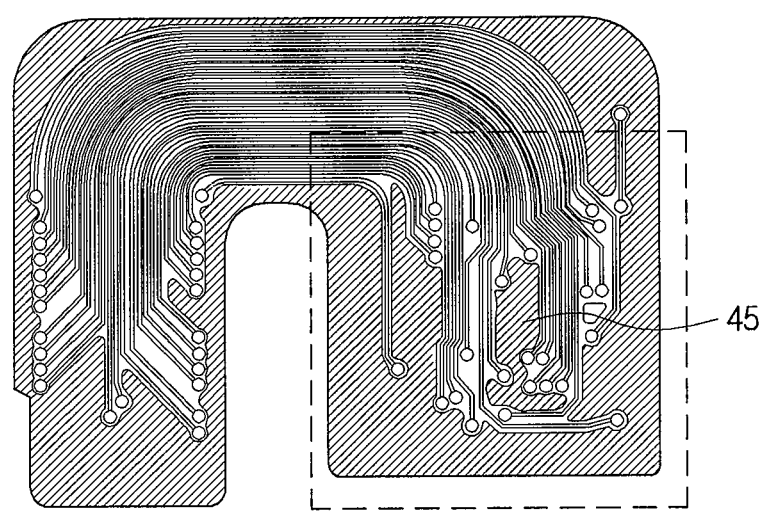
Figure 6:
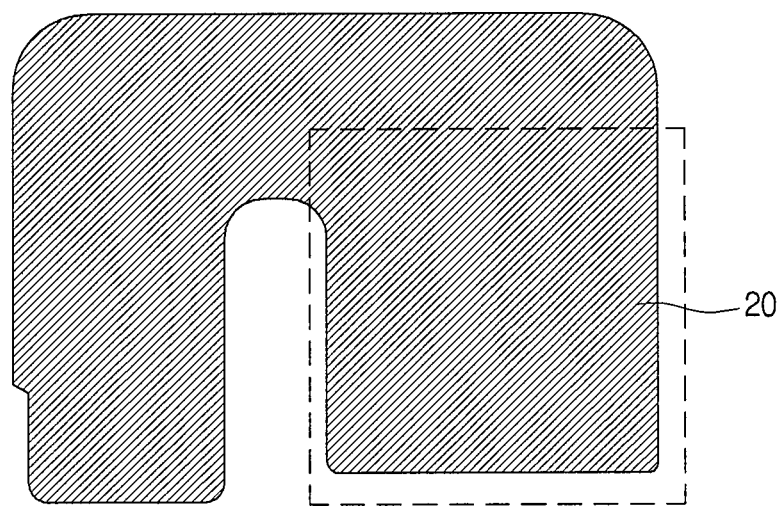

FIG. 3 illustrates a sectional view of the printed circuit board 50 in the camera module according to an embodiment of the invention, and FIG. 4 through FIG. 6 illustrate circuit pattern arrangement of the printed circuit board in the camera module according to an embodiment of the invention.

The printed circuit board 50 in accordance with this embodiment includes a binding part 10, a first ground 20 and a second ground 30.

The binding part 10 is a part that is coupled to the aforementioned camera head unit 60 and includes the binding pads 12, which is joined to the camera head unit 60.

In this embodiment, since the binding pads 12 is thermally coupled to the electrode pad of the camera head unit 60, the binding pads 12 is arrayed to correspond to the electrode pad. Specifically, as illustrated in FIG. 3, the printed circuit board 50 of this embodiment includes a multi-layered circuit layer 40 and the circuit layer 40 has the binding pads 12 formed on one side in the opposite to the camera head unit.

The first ground 20, in addition to having the function of an electric potential reference point of the circuit, is a part that receives the heat needed for thermal binding from the heater 80 at the time of thermal binding. For the purpose of this, the first ground 20 is arrayed in an area that is heated by the heater 80 at the time of thermal binding. The heat transferred from the heater 80 to the first ground 20 can be quickly transferred to various places of the printed circuit board 50 through the ground circuit made of a metal that has high heat conductivity, for example, copper.

As illustrated in FIG. 3, the first ground 20 in accordance with this embodiment is formed on the other side of the circuit layer 40 that is facing the heater 80. Accordingly, since the first ground 20 has a direct surface contact with a heating part 82 of the heater 80, it is possible to absorb the heat transferred from the heater 80 quickly and efficiently.

Here, in order to form a shortest heat transfer path, the first ground 20 can be arrayed in the opposite side to the circuit layer 40 corresponding to the position of the binding part 10. In addition, as illustrated in FIG. 6, for the purpose of transferring even heat to the binding part 10, the first ground 20 having the arrangement and size corresponding to the area of the binding part 10 can be formed.

The second ground 30, in addition to having the function of an electric potential reference point of the circuit, is a part that transfers the heat to the binding part 10 at the time of thermal binding. For the purpose of this, the second ground 30 is connected to the first ground 20 and arrayed adjacent to the binding pads 12. Accordingly, the heat absorbed from heater 80 can be quickly and efficiently transferred to the binding pads 12. The heat absorbed from the first ground 20 can be quickly transferred to the second ground 30, and the binding pads 12 can be quickly heated through the second ground 30, which is arrayed adjacent to the binding pads 12.

Here, in order to form the shortest thermal transfer path connecting the first ground 20 to the second ground 30, a via 25, which directly connects the first ground 20 to the second ground 30, can be formed on the circuit layer 40

In addition, the circuit layer 40 can increase the efficiency of thermal transfer by further including a third ground 45 that is connected to the first ground 20 or the second ground 30 and arrayed corresponding to the binding part 10. Specifically, as illustrated in FIG. 5, the third ground 45 can be arrayed below the binding pads 12.

As described above, the printed circuit board 50 in accordance with an embodiment of the present invention can allow thermal binding even in a multi-layered structure by forming a heat transfer path using the ground at the time of thermal binding with the camera head unit 60. Accordingly, components can be mounted and many signal circuits can be formed in the multi-layered printed circuit board 50.

Although the printed circuit board 50 used in the camera module is provided in this embodiment, the present invention is not limited to this particular embodiment, and the printed circuit board 50 of the present invention can be used in thermally binding with various devices.

Hitherto, although an embodiment of the present invention has been shown and described, it shall be appreciated by any person of ordinary skill in the art that a large number of modifications, permutations and additions are possible within the principles and spirit of the invention, the scope of which shall be defined by the appended claims and their equivalents.

What is claimed is:

1. A printed circuit board thermally coupled to an electronic device, comprising:
   a multi-layered circuit layer extending horizontally;
   a binding pad disposed on and in contact with an upper surface of the circuit layer and coupled to the electronic device;
   a first ground disposed on a lower surface of the circuit layer and arrayed in an area heated at the time of thermal binding;
   a second ground, connected to the first ground and disposed on and in contact with the upper surface of the circuit layer and arrayed adjacent to the binding pad; and
   a via directly connecting the first ground to the second ground, wherein:
   a portion of the first ground is arrayed on an opposite side of the circuit layer to a side on which the binding pad is disposed, such that a horizontal planar position of said portion of the first ground corresponds to a horizontal planar position of the binding pad and that said portion of the first ground covers and is superimposed on at least a portion of the binding pad.

2. The printed circuit board of claim 1, further comprising:
   a third ground connected to the first ground or the second ground and arrayed to correspond to the binding pad.

3. The printed circuit board of claim 2, wherein the third ground is arrayed on a lower side of the binding pad.

4. The printed circuit board of claim 1, wherein the first ground has a surface contact with a heater.

5. A camera module, comprising:
   a camera head unit, having a lens and an image sensor;
   a printed circuit board, coupled to the camera head unit; and
   a thermal binding member, interposed between the camera head unit and the printed circuit board, wherein:
   the printed circuit board comprises:
   a multi-layered circuit layer extending horizontally;
   a binding pad disposed on and in contact with an upper surface of the circuit layer and coupled to the thermal binding member;
   a first ground disposed on a lower surface of the circuit layer and arrayed in an area heated at the time of thermal binding;

a second ground connected to the first ground and disposed on and in contact with the upper surface of the circuit layer and arrayed adjacent to the binding pad; and a via directly connecting the first ground to the second ground, a portion of the first ground is arrayed on an opposite side of the circuit layer to a side on which the binding pad is disposed, such that a horizontal planar position of said portion of the first ground corresponds to a horizontal planar position of the binding pad and that said portion of the first ground covers and is superimposed on at least a portion of the binding pad.

6. The camera module of claim 5, wherein the printed circuit board further comprises a third ground connected to the first ground or the second ground and arrayed to correspond to the binding pad.

7. The camera module of claim 6, wherein the third ground is arrayed on a lower side of the binding pad.

8. The camera module of claim 5, wherein the thermal binding member comprises at least one of solder and ACF (Anisotropic Conductive Film).

\* \* \* \* \*